United States Patent
Katayama

(10) Patent No.: US 12,087,886 B2
(45) Date of Patent: Sep. 10, 2024

(54) HEADER FOR SEMICONDUCTOR PACKAGE, AND SEMICONDUCTOR PACKAGE

(71) Applicant: SHINKO ELECTRIC INDUSTRIES CO., LTD., Nagano (JP)

(72) Inventor: Wataru Katayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 443 days.

(21) Appl. No.: 17/454,100

(22) Filed: Nov. 9, 2021

(65) Prior Publication Data

US 2022/0181525 A1 Jun. 9, 2022

(30) Foreign Application Priority Data

Dec. 9, 2020 (JP) ................. 2020-204085

(51) Int. Cl.
*H01L 33/48* (2010.01)
*H01L 33/62* (2010.01)

(52) U.S. Cl.
CPC ............ *H01L 33/486* (2013.01); *H01L 33/62* (2013.01)

(58) Field of Classification Search
CPC ..... H01L 33/486; H01L 33/483; H01L 33/48; H01S 5/023
See application file for complete search history.

(56) References Cited

FOREIGN PATENT DOCUMENTS

| EP | 2981163 | | 2/2016 |
| JP | 10125996 | * | 5/1998 |
| JP | 2006-310548 | | 11/2006 |
| JP | 2004235212 | * | 8/2019 |
| KR | 10-2010-0045308 | | 5/2010 |

* cited by examiner

*Primary Examiner* — David A Zarneke
(74) *Attorney, Agent, or Firm* — IPUSA, PLLC

(57) ABSTRACT

A header for a semiconductor package includes an eyelet having a first surface, a second surface opposite to the first surface, and a through hole penetrating the eyelet from the first surface to the second surface, and a metal block having a pedestal, and a columnar part protruding from the pedestal. The pedestal is inserted into the through hole, so that a portion of the columnar part protrudes from the first surface. The columnar part includes a device mounting surface on which a semiconductor device is mounted. An outer periphery of the pedestal is exposed around the columnar part in a plan view.

10 Claims, 6 Drawing Sheets

HEADER FOR SEMICONDUCTOR PACKAGE, AND SEMICONDUCTOR PACKAGE

CROSS-REFERENCE TO RELATED APPLICATIONS

This application is based upon and claims priority to Japanese Patent Application No. 2020-204085, filed on Dec. 9, 2020, the entire contents of which are incorporated herein by reference.

FIELD

Certain aspects of the embodiments discussed herein are related to headers for semiconductor packages, methods for manufacturing headers for semiconductor packages, and semiconductor packages.

BACKGROUND

In a header for a semiconductor package, used to mount a semiconductor device such as a light emitting device, a known structure includes a metal block protruding from an upper surface of a disk-shaped eyelet, for example. One surface of the metal block is used as a device mounting surface for mounting the semiconductor device. The eyelet is provided with a plurality of through holes inserted with lead terminals, and the lead terminals are sealed inside the through holes by a sealing portion such as glass.

The device mounting surface for mounting the semiconductor device needs to be flat. For this reason, in conventional headers for semiconductor packages, after providing the metal block on the eyelet, the device mounting surface and a surface on the opposite side from the device mounting surface are pressed from both sides by being sandwiched by a flat die, for example, to planarize the device mounting surface by a flattening process. However, according to this method, a portion of the device mounting surface connecting to the upper surface of the eyelet may become rounded due to rollover. As a result, it was difficult to positively secure a flat region for the device mounting surface.

An example of a sealed terminal structure is proposed in Japanese Laid-Open Patent Publication No. 2004-235212, for example.

SUMMARY

Accordingly, it is an object in one aspect of the embodiments to provide a header for a semiconductor package, which can positively secure a flat region for a device mounting surface.

According to one aspect of the embodiments, a header for a semiconductor package includes an eyelet having a first surface, a second surface opposite to the first surface, and a through hole penetrating the eyelet from the first surface to the second surface; and a metal block having a pedestal, and a columnar part protruding from the pedestal, wherein the pedestal is inserted into the through hole, so that a portion of the columnar part protrudes from the first surface, wherein the columnar part includes a device mounting surface on which a semiconductor device is mounted, and wherein an outer periphery of the pedestal is exposed around the columnar part in a plan view.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
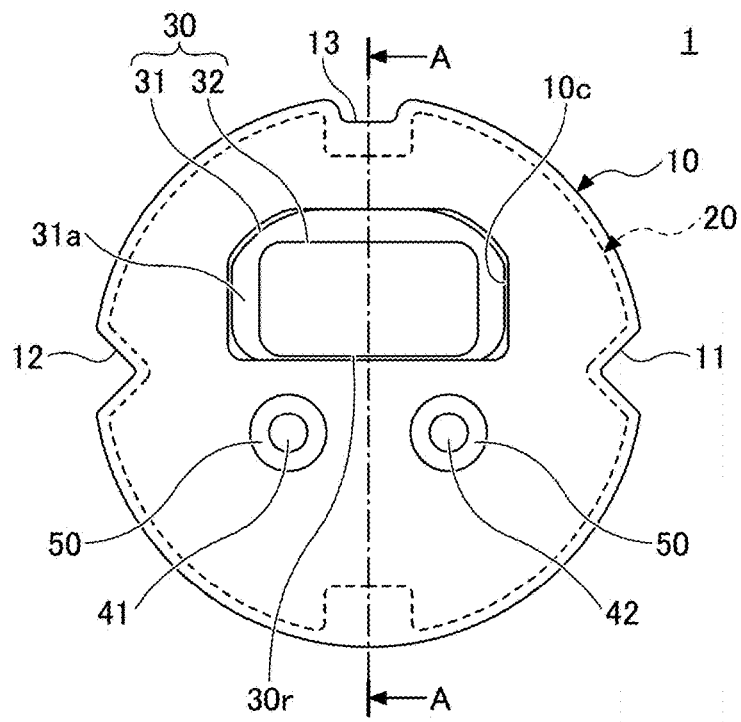
FIG. 1A and FIG. 1B are diagrams illustrating an example of a header for a semiconductor package according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a stem for a semiconductor package, a method for manufacturing the stem for the semiconductor package, and the semiconductor package according to each embodiment of to the present invention.

First Embodiment

Figure 1B:
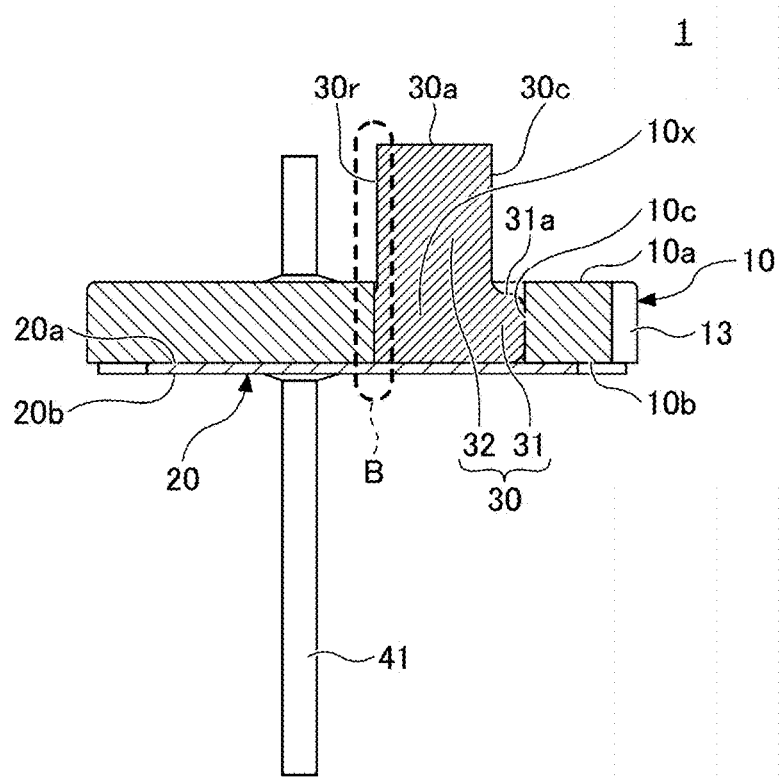

FIG. 1A and FIG. 1B are diagrams illustrating an example of the header for the semiconductor package according to a first embodiment. FIG. 1A is a plan view of the header, and FIG. 1B is a cross sectional view of the header along a line A-A in FIG. 1A.

As illustrated in FIG. 1A and FIG. 1B, a header 1 for a semiconductor package (hereinafter also referred to as a "semiconductor package header 1") according to the first embodiment includes an eyelet 10, a metal base 20, a metal block 30, a first lead 41, a second lead 42, and a sealer 50.

The eyelet 10 is a disk-shaped member. The eyelet 10 includes a through hole 10x which penetrates the eyelet 10 from an upper surface 10a to a lower surface 10b.

In this specification, the term "disk-shaped" refers to a planar shape of the member which is approximately circular and has a predetermined thickness. The thickness relative to a diameter of the disk-shaped member is not particularly limited. In addition, the disk-shaped member may partially include a portion famed with a recess, a protrusion, a through hole, or the like. In this specification, a plan view of an object refers to a view of the object from above the object, viewed in a normal direction to the upper surface 10a of the eyelet 10, and the planar shape of the object refers to the shape of the object in the plan view viewed in the normal direction to the upper surface 10a of the eyelet 10.

Cutouts 11, 12, and 13 are formed in an outer edge of the eyelet 10. In the plan view, the cutouts 11, 12, and 13 have shapes caving in from an outer periphery toward a center of the eyelet 10. The cutouts 11, 12, and 13 have planar shapes which are generally triangular or generally rectangular, for example. The cutout 11 and the cutout 12 may be disposed to oppose each other, for example.

The cutouts 11 and 12 may be used for positioning a device mounting surface or the like when the semiconductor package header 1 is mounted with a semiconductor device, for example. The cutout 13 may be used for positioning a rotating direction or the like of the semiconductor package header 1, for example. However, the cutouts 11, 12, and 13 may be provided, as required.

A diameter of the eyelet 10 is not particularly limited, and may be determined appropriately according to the needs or purpose. For example, the diameter of the eyelet 10 may be 5.6 mm, 9.0 mm, or the like. A thickness of the eyelet 10 is not particularly limited, and may be determined appropriately according to the needs or purpose. For example, the thickness of the eyelet 10 may be in a range of approximately 0.5 mm to approximately 3 mm.

The eyelet 10 may be formed of a metallic material, such as iron, stainless steel, or the like, for example. The eyelet 10 may be formed of a metallic material (for example, a so-called cladding material) in which a plurality of metal layers (for example, copper layers, iron layers, or the like) are laminated. A surface of the eyelet 10 may be plated.

The metal base 20 may be a member having a generally circular planar shape which is slightly smaller than the planar shape of the eyelet 10. In other words, in the plan view, an external shape of the metal base 20 is smaller than an external shape of the eyelet 10, and no portion of the metal base 20 extends beyond the external shape of the eyelet 10. No through holes are famed in the metal base 20 except the portions where the first lead 41 and the second lead 42 penetrate the metal base 20. The metal base 20 is bonded to the lower surface 10b of the eyelet 10, so as to close one end of the through hole 10x.

A thickness of the metal base 20 is less than the thickness of the eyelet 10, and may be in a range of approximately 0.1 mm to approximately 0.4 mm, for example. A thermal conductivity of the metal base 20 is greater than or equal to a thermal conductivity of the eyelet 10. For example, if a material used for the eyelet 10 is iron, a material used for the metal base 20 may be copper having a higher thermal conductivity than the eyelet 10. In this case, it is possible to improve heat dissipation of the semiconductor package header 1.

If the material used for the eyelet 10 is iron, the material used for the metal base 20 may also be iron. When the eyelet 10 and the metal base 20 are formed of the same material, coefficients of thermal expansion of the eyelet 10 and the metal base 20 become the same. For this reason, it is possible to reduce defamation of the eyelet 10 and the metal base 20 caused by heat, and improve a hermetic seal of the semiconductor package illustrated in FIG. 6 which is manufactured to have the semiconductor device mounted on the semiconductor package header 1, as will be described later in the specification.

The metal block 30 includes a pedestal (or seat) 31, and a columnar part 32 protruding from an upper surface 31a of the pedestal 31. The pedestal 31 and the columnar part 32 are integrally famed. The columnar part 32 includes a device mounting surface 30r on which a semiconductor device is mounted. The semiconductor device may be a light emitting device, such as a laser, for example. The device mounting surface 30r is provided so as to be approximately perpendicular to the upper surface 10a of the eyelet 10. The upper surface 31a of the pedestal 31 may not necessarily be a flat surface.

The pedestal 31 is inserted into the through hole 10x of the eyelet 10, and bonded to the metal base 20 inside the through hole 10x. The columnar part 32 includes a portion protruding from the upper surface 10a of the eyelet 10. A large portion of the columnar part 32 may protrude from the upper surface 10a of the eyelet 10. The columnar part 32 in its entirety may protrude from the upper surface 10a of the eyelet 10, however, a portion of the columnar part 32 at the pedestal 31 is preferably located inside the through hole 10x. The lower surface 30b of the metal block 30 and the lower surface 10b of the eyelet 10 may lie approximately on the same plane.

In the plan view, an outer periphery of the upper surface 31a of the pedestal 31 is exposed around the columnar part 32. At the outer periphery of the upper surface 31a of the pedestal 31 exposed around the columnar part 32, a width of the upper surface 31a at the device mounting surface 30r is narrower than the width of the upper surface 31a at surfaces other than the device mounting surface 30r. In other words, in the plan view, a center of the columnar part 32 is offset with respect to a center of the pedestal 31 along a direction of a line A-A toward the first lead 41 and second lead 42. At the outer periphery of the upper surface 31a of the pedestal 31 exposed around the columnar part 32, the width of the upper surface 31a at the device mounting surface 30r may be approximately 0.05 mm, and the width of the upper surface 31a at the surfaces other than the device mounting surface 20r may be approximately 0.5 mm, for example. Such a shape of the columnar part 32 can positively secure a sufficiently large area to dispose the first lead 41 and the second lead 42 in the eyelet 10.

In the plan view, the pedestal 31 has a generally rectangular shape, but corners at both ends of a first side of the pedestal 31 at the device mounting surface 30r (on the side of the first lead 41 and the second lead 42) are rounded, and corners at both ends of a second side of the pedestal 31, opposing the first side, are rounded with a radius larger than that of the corners at both ends of the first side. Such a shape of the pedestal 31 facilitates the arrangement of the pedestal 31 along the shape of the eyelet 10.

In the plan view, the columnar part 32 has a generally rectangular shape, but corners at both ends of a first side of the columnar part 32 at the device mounting surface 30r are rounded, and corners at both ends of a second side opposing the first side are rounded to the same extent as the corners at both ends of the first side. The columnar part 32 is a part for mounting and fixing the semiconductor device when the semiconductor package header 1 is used as a semiconductor package mounted with the semiconductor device, and also functions as a heat sink for dissipating heat generated from the semiconductor device. Such a shape of the columnar part 32 described above can secure a sufficiently large volume of the columnar part 32, and improve the heat dissipation.

A distance between the upper surface 30a of the metal block 30 and the upper surface 10a of the eyelet 10, that is, a protruding distance of the columnar part 32 from the upper surface 10a of the eyelet 10, may be in a range of approximately 2 mm to approximately 3 mm, for example. A material having a higher thermal conductivity than the eyelet 10 may be used for the metal block 30. If the material used for the eyelet 10 is iron, the material used for the metal block 30 may be copper, for example.

Figure 2:
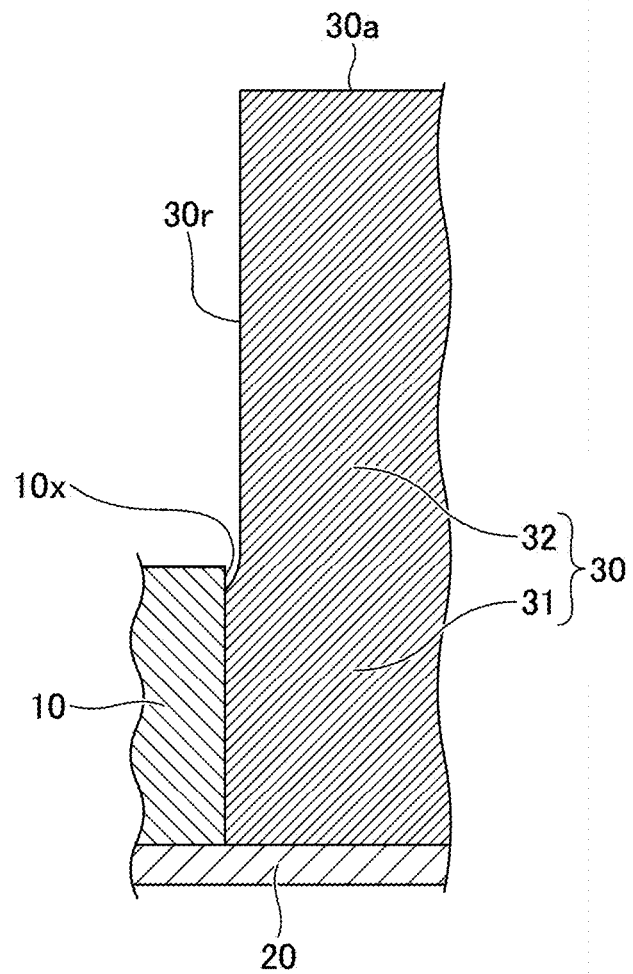
FIG. 2 is a cross sectional view, on an enlarged scale, illustrating a portion of a part B illustrated in FIG. 1B.

FIG. 2 is a cross sectional view, on an enlarged scale, illustrating a portion of a part B illustrated in FIG. 1B. As illustrated in FIG. 2, a portion of the device mounting surface 30r is preferably located inside the through hole 10x. Due to reasons during the process of forming (or preparing) the metal block 30, the rollover occurs in a rollover region at the pedestal 31 of the device mounting surface 30r. The term "rollover" refers to a rounded edge that is made in an area of a material next to an edge of a die by yielding in the direction of the applied force when the material is forged in the die. The rollover region becomes rounded and does not become flat. Because a portion of the device mounting surface 30r is located inside the through hole 10x, the rollover region of the device mounting surface 30r can be inserted into the through hole 10x. Preferably, the entire rollover region of the device mounting surface 30r is located inside the through hole 10x. In this case, it is possible to increases an area of a flat region of the device mounting surface 30r at the portion protruding from the upper surface 10a of the eyelet 10. As a result, it is possible to mount relatively large devices.

Returning to the description of FIG. 1A and FIG. 1B, the first lead 41 and the second lead 42 are inserted into lead-inserting through holes penetrating the eyelet 10 and the metal base 20 in a thickness direction, with a longitudinal direction of the first lead 41 and the second lead 42 extending in the thickness direction. Inside the lead-inserting through holes of the eyelet 10, the peripheries of the first lead 41 and the second lead 42 are sealed by the sealer 50. Portions of each of the first lead 41 and the second lead 42 protrude from the upper surface 10a of the eyelet 10 and the lower surface 20b of the metal base 20. The protruding distance of each of the first lead 41 and the second lead 42 from the lower surface 20b of the metal base 20 may be in a range of approximately 6 mm to approximately 7 mm, for example.

The first lead 41 and the second lead 42 may be formed of a metal, such as 50% iron-nickel alloy, Kovar, or the like, for example. The sealer 50 is formed of an insulating material, such as glass or the like, for example. The first lead 41 and the second lead 42 are electrically connected to the semiconductor device mounted on the semiconductor package header 1, for example. The number of leads may be increased according to the specification of the semiconductor device mounted on the semiconductor package header 1.

FIG. 3 and FIG. 4A through FIG. 4C are diagrams illustrating an example of the manufacturing process of the semiconductor package header according to the first embodiment.

Figure 3:
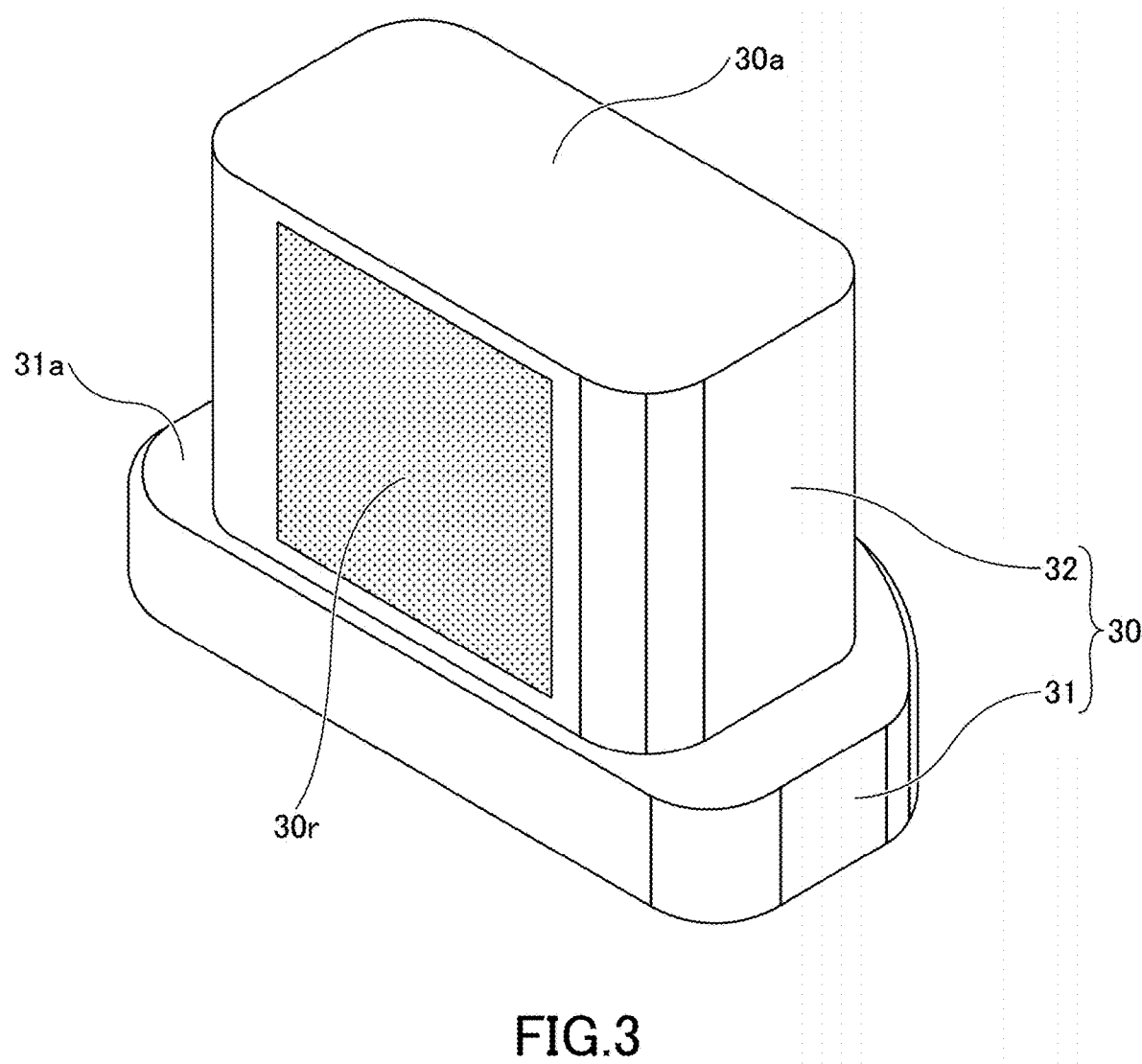
FIG. 3 is a perspective view (part 1) illustrating an example of a manufacturing process of the header for the semiconductor package according to the first embodiment.

First, as illustrated in FIG. 3, the metal block 30, provided with the pedestal 31, and the columnar part 32 protruding from the pedestal 31, is formed (or prepared). The metal block 30 may be famed (or prepared) by forming a rod-shaped material into a predetermined shape by a drawing process, and cutting the material having the predetermined shape by a singulating process. The singulated material becomes the pedestal 31 and the columnar part 32. Thereafter, a forming process is performed on each singulated material using a die. More particularly, with respect to each singulated material, the forming process presses a periphery of a portion of each singulated material, which becomes the columnar part 32, using the die, and a planarizing process is performed to planarize a portion of the columnar part 32, which becomes the device mounting surface 30r. Hence, the pressed portion becomes smaller than the non-pressed portion. In other words, the pressed portion becomes the columnar part 32, the non-pressed portion becomes the pedestal 31, thereby completing the shape illustrated in FIG. 3. In the plan view, the outer periphery of the pedestal 31 is exposed around the columnar part 32. In this specification, a "flat" surface refers to a surface having a maximum flatness of approximately 0.005 mm. In FIG. 3, a flat portion of the device mounting surface 30r is indicated by a dot pattern.

Figure 4A:
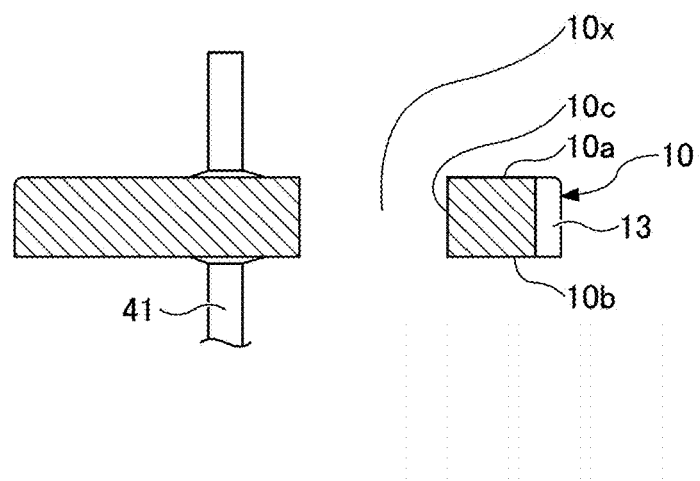
FIG. 4A, FIG. 4B, and FIG. 4C are diagrams (part 2) illustrating the example of the manufacturing process of the header for the semiconductor package according to the first embodiment.

Next, as illustrated in FIG. 4A, the eyelet 10, having the through hole 10x, and the lead-inserting through holes for inserting the first lead 41 and the second lead 42, penetrating the eyelet 10 from the upper surface 10a to the lower surface 10b, is famed (or prepared) by a stamping process or the like. Then, the first lead 41 and the second lead 42 are inserted into the lead-inserting through holes of the eyelet 10, and the peripheries of the first lead 41 and the second lead 42 are sealed by the sealer 50 inside the lead-inserting through holes.

Figure 4B:
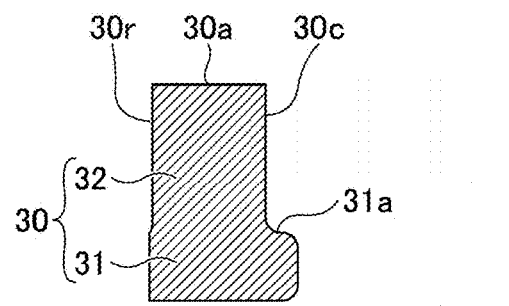
Figure 4B:
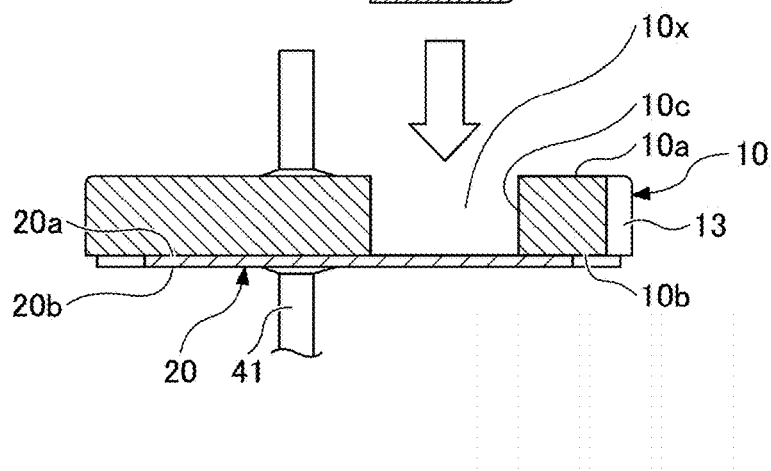

Next, as illustrated in FIG. 4B, a metal bonding material (not illustrated) is disposed on the upper surface 20a of the metal base 20, and further, the structure illustrated in FIG. 4A is disposed on the metal bonding material. Then, the pedestal 31 of the metal block 30 is inserted into the through hole 10x of the eyelet 10, and disposed so that at least a portion of the columnar part 32 protrudes from the upper surface 10a of the eyelet 10. The lower surface 30b of the metal block 30 makes contact with the metal bonding material.

Figure 4C:
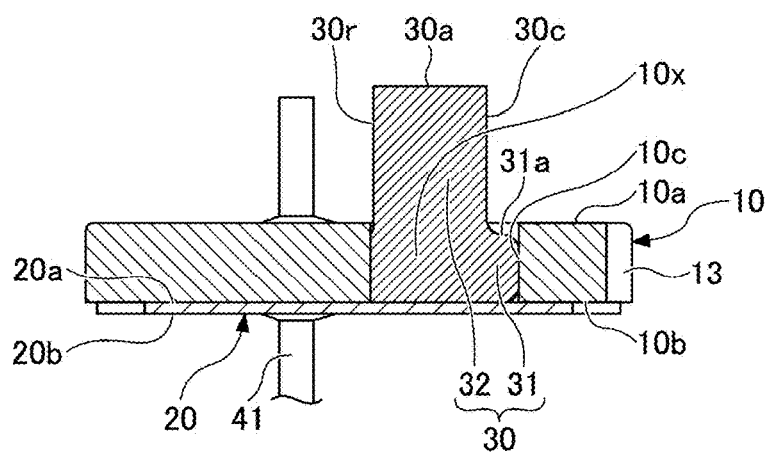

Next, as illustrated in FIG. 4C, the metal bonding material is heated to a temperature higher than a melting point of the metal bonding material, to melt the metal bonding material and thereafter solidify the metal bonding material. In this state, the eyelet 10 and the metal block 30 may be pressed toward the metal base 20. Because the metal bonding material melts and becomes thin to a substantially uniform thickness, the lower surface 30b of the metal block 30 and the lower surface 10b of the eyelet 10 lie approximately on the same plane. In addition, a portion of the melted metal bonding material enters a gap between a side surface of the pedestal 31 (that is, a portion of a side surface 30c of the metal block 30) and an inner wall surface 10c of the through hole 10x of the eyelet 10 due to capillary action, and solidifies in a state filling this gap. Hence, the eyelet 10, the metal base 20, and the metal block 30 are bonded.

Accordingly, the lower surface 30b of the metal block 30 is bonded to the upper surface 20a of the metal base 20 by the metal bonding material, and the side surface 30c of the metal block 30 is bonded to the inner wall surface 10c of the through hole 10x of the eyelet 10 by the metal bonding material. Moreover, the lower surface 10b of the eyelet 10 is bonded to the upper surface 20a of the metal base 20 by the metal bonding material. As a result, the semiconductor package head 1 is completed.

The process of manufacturing the semiconductor package, having the semiconductor device mounted on the semiconductor package header 1, may include a heating process of heating the semiconductor package to approximately 300° C. For this reason, a material used for the metal bonding material which bonds the eyelet 10, the metal base 20, and the metal block 30, preferably has a melting point of 350° C. or higher. For example, a silver solder having a melting point of approximately 800° C. may be used for the metal bonding material.

The method of manufacturing the conventional semiconductor package header does not include the forming process described above in conjunction with FIG. 3. Instead, after the process of FIG. 4C, the device mounting surface and the surface on the opposite side from the device mounting surface are pressed from both sides by being sandwiched by the flat die, for example, to planarize the device mounting surface by the flattening process. However, according to this method, a portion of the device mounting surface connecting to the upper surface of the eyelet may become rounded due to rollover. As a result, it was difficult to positively secure a flat region for the device mounting surface. In addition, according to this method, stress during flattening process is transmitted to the sealer which seals the lead terminals, and cracks may be formed in the sealer.

On the other hand, according to the semiconductor package header 1, the forming process is performed on the individual metal block to planarize the device mounting surface, thereby eliminating the need for the flattening process. In other words, the metal block 30 including the pedestal 31, and the columnar part 32 protruding from the pedestal 31, is formed (or prepared) in advance, to form the structure in which the pedestal 31 is inserted into the through hole 10x of the eyelet 10, and the columnar part 32 protrudes from the upper surface 10a of the eyelet 10. Accordingly, it is possible to obtain the semiconductor package header 1 which can positively secure the flat region of the device mounting surface 30r. In addition, it is possible to eliminate the problem of cracks being formed in the sealer 50. Further, as illustrated in FIG. 2, when the device mounting surface 30r is formed to extend below the upper surface 10a of the eyelet 10, it is possible to increase the area of the flat region of the device mounting surface 30r.

Figure 5:
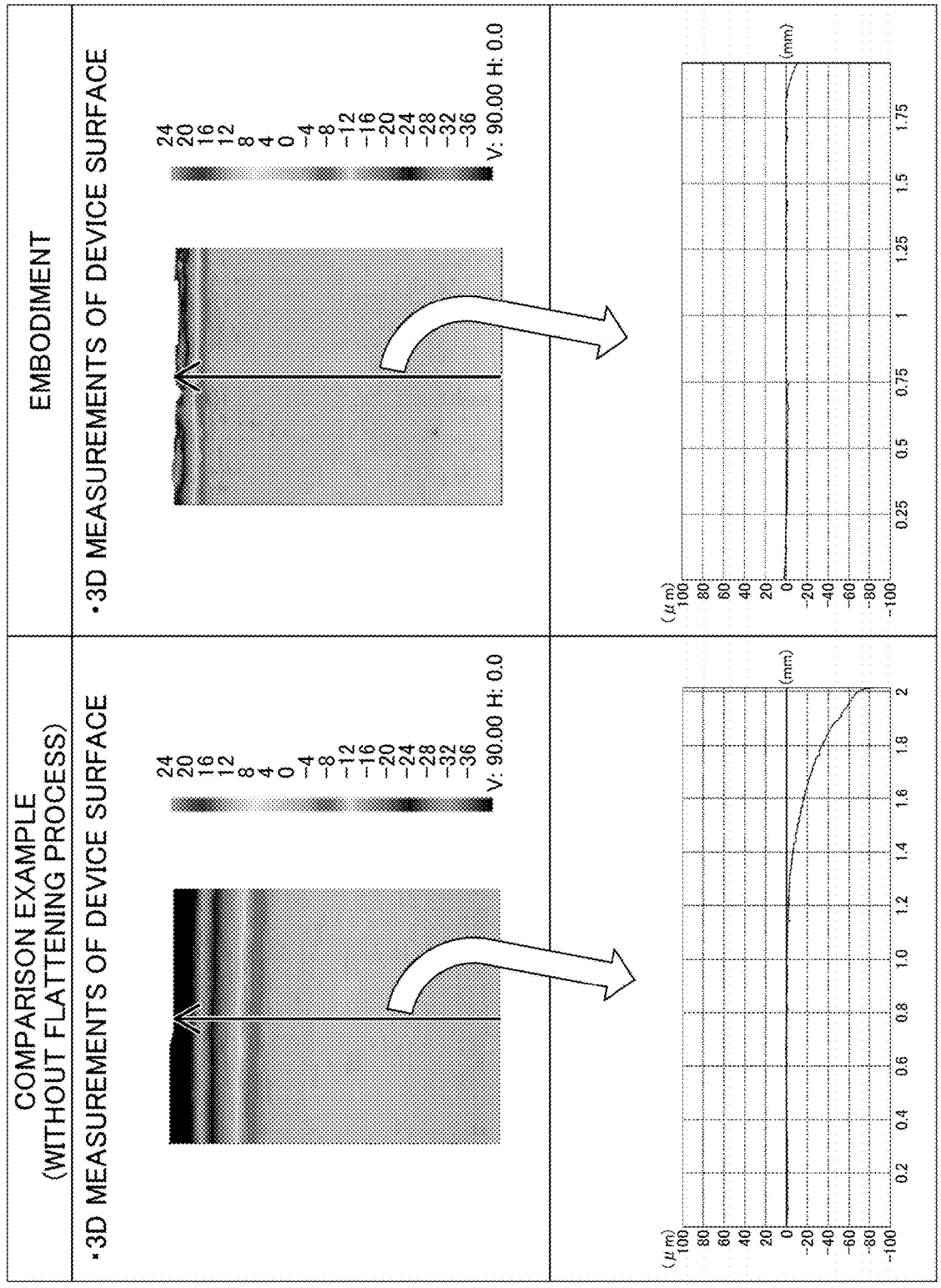
FIG. 5 is a diagram illustrating an example of a measured flatness of a device mounting surface.

FIG. 5 is a diagram illustrating an example of a measured flatness of the device mounting surface. A left half of FIG. 5 illustrates data of the device mounting surface of the conventional semiconductor package header manufactured without performing the flattening process, as a comparison example. A right half of FIG. 5 illustrates data of the device mounting surface of the semiconductor package header 1 according to the present embodiment. In each of the upper left half and the upper right half of FIG. 5, an upward pointing arrow indicates a position where the flatness is measured. Moreover, in each of the lower left half and the lower right half of FIG. 5, the abscissa indicates a position on the arrow in the corresponding upper half of FIG. 5, where "0" on the abscissa corresponds to a root of the arrow, and "2.0 mm" on the abscissa corresponds approximately to a tip end of the arrow. Further, in each of the lower left half and the lower right half of FIG. 5, the ordinate indicates a height when the height of the flat portion at the root of the arrow is "0". In this example, in a graph for the comparison example in the lower left half of FIG. 5, the tip end of the arrow is approximately 80 μm lower compared to the tip end of the arrow in a graph for the present embodiment in the lower right half of FIG. 5. As may be seen by comparing the left half and the right half of FIG. 5, the semiconductor package header 1 according to the present embodiment can reduce the rollover region of the device mounting surface compared to the conventional semiconductor package header. In other words, in the semiconductor package header 1 according to the present embodiment, a relatively large area of the flat region of the device mounting surface 30r can be secured without performing flattening process. Further, because the rollover region can be disposed below the upper surface 10a of the eyelet 10 according to the semiconductor package header 1, an even larger area of the flat region of the device mounting surface 30r can be secured.

In addition, in the semiconductor package header 1, the metal base 20, having a thermal conductivity greater than or equal to the thermal conductivity of the eyelet 10, is bonded to the lower surface 10b of the eyelet 10 so as to close one end of the through hole 10x. Moreover, one end of the metal block 30, nearer to the lower surface 30b, is inserted into the through hole 10x and bonded to the metal base 20 inside the through hole 10x, and the other end of the metal block 30, nearer to the upper surface 30a, protrudes from the upper surface 10a of the eyelet 10. Further, the lower surface 30b of the metal block 30 and the lower surface 10b of the eyelet 10 lie approximately on the same plane.

According to the structure described above, the lower surface 30b of the metal block 30 can be brought nearer to the metal base 20 which functions as the heat sink when the semiconductor device is mounted on the device mounting surface 30r of the metal block 30. In addition, the volume of the metal block 30 can be increased by inserting the metal block 30 into the through hole 10x. As a result, it is possible to improve the heat dissipation of the semiconductor package header 1.

Second Embodiment

In a second embodiment, an example of the semiconductor package includes the light emitting device, which is an example of the semiconductor device, mounted on the semiconductor package header according to the first embodiment. In the second embodiment, those parts that are the same as corresponding parts of the embodiment described above are designated by the same reference numerals, and a repeated description of the same parts may be omitted.

Figure 6A:
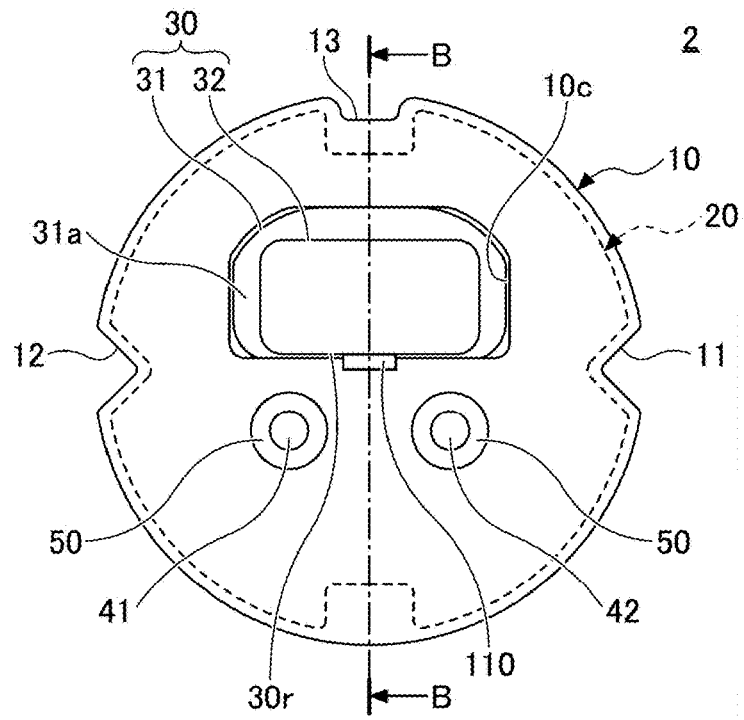
FIG. 6A and FIG. 6B are diagrams illustrating an example of the semiconductor package according to a second embodiment.
Figure 6B:
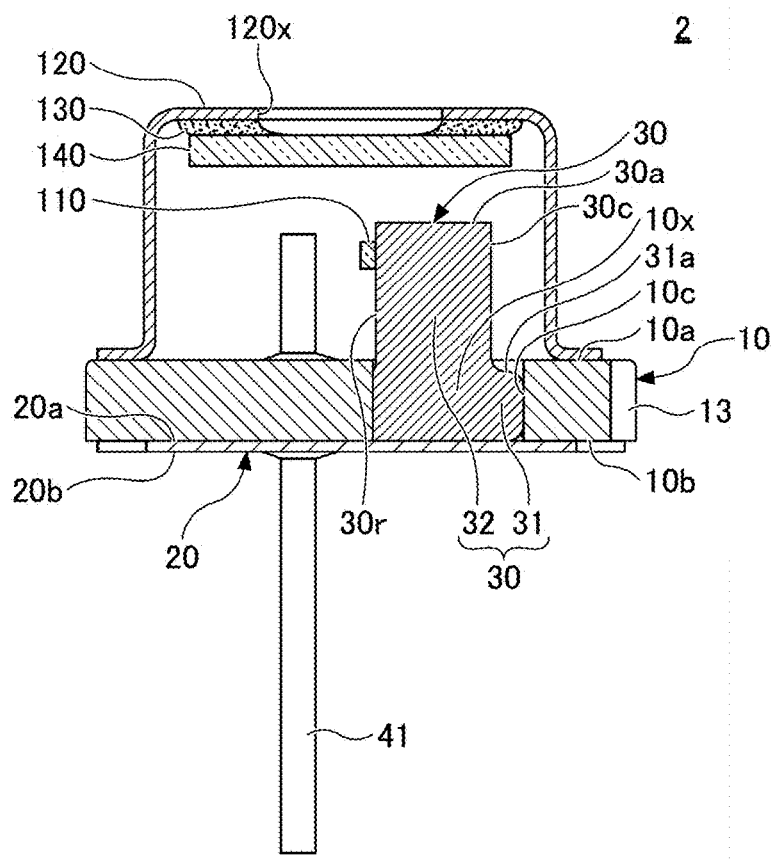

FIG. 6A and FIG. 6B are diagrams illustrating an example of the semiconductor package according to the second embodiment. FIG. 6A is a plan view of the semiconductor package, and FIG. 6B is a cross sectional view of the semiconductor package along a line B-B in FIG. 6A.

As illustrated in FIG. 6A and FIG. 6B, a semiconductor package 2 includes the semiconductor package header 1 illustrated in FIG. 1A, FIG. 1B, or the like, a light emitting device 110, a cap 120, an adhesive 130, and a transparent member 140.

The light emitting device 110 may be a semiconductor laser chip which emits light having a wavelength of 405 nm, 650 nm, or 780 nm, for example. The light emitting device 110 is fixed to the device mounting surface 30r of the metal block 30, so that one end surface of the light emitting device 110 faces up toward the transparent member 140, and the other end surface of the light emitting device 110 faces down toward the upper surface 10a of the eyelet 10. In the plan view of the semiconductor package 2, for example, the light emitting device 110 is mounted so that a light emission position of the light emitting device 110 approximately coincides with the center of the upper surface 10a of eyelet 10. Electrodes (not illustrated) of the light emitting device 110 are connected to the first lead 41 and the second lead 42, respectively, via bond wires or the like, for example.

The cap 120 is formed of a metal, such as iron, copper, or the like, for example. An opening (or window) 120x is provided at a center of the cap 120 in the plan view. The transparent member 140 is formed of glass or the like, for example, and is bonded to a surface (inner surface) of the cap 120 nearer to the eyelet 10, by the adhesive 130 made of low melting glass or the like, so as to close the opening 120x. The cap 120, having the transparent member 140 bonded thereto by the adhesive 130, is bonded near the outer edge of the upper surface 10a of the eyelet 10 by welding or the like, for example, to hermetically seal the light emitting device 110.

The light (for example, laser light) emitted from one end surface of the light emitting device 110 is transmitted through the transparent member 140 at the opening 120x, and is emitted outside the semiconductor package 2. The light emitted from the other end surface of the light emitting device 110 may be detected by a photodiode or the like, to monitor the amount of light emitted from the light emitting device 110. By controlling the amount of light detected by the photodiode by a circuit disposed outside the semiconductor package 2, the amount of light emitted from the semiconductor package 2 can be controlled constant regardless of an ambient temperature or the like.

As described above, the semiconductor package 2 can be obtained by mounting the light emitting device 110 on the device mounting surface 30*r* of the semiconductor package header 1. Because the semiconductor package header 1 has the device mounting surface 30*r* with the flat region having a large area compared to the conventional semiconductor package header, it is easy to mount the light emitting device 110 in the semiconductor package 2. Further, because the semiconductor package header 1 has an excellent, improved heat dissipation compared to the conventional semiconductor package header, the heat generated from the light emitting device 110 in the semiconductor package 2 can be efficiently dissipated outside the semiconductor package 2.

In the second embodiment, the light emitting device 110 is mounted on the semiconductor package header 1. However, the semiconductor device mounted on the semiconductor package header 1 in the present disclosure is not limited to the light emitting device 110. A heat generating semiconductor device, other than the light emitting device 110, may be mounted on the semiconductor package header 1. In addition, the semiconductor package having the semiconductor device mounted on the semiconductor package header 1 may be used for various sensors, inflators, or the like.

Accordingly to each of the embodiments described above, it is possible to provide a header for a semiconductor package, a method for manufacturing the header for the semiconductor package, and the semiconductor package, which can positively secure a flat area for a device mounting surface.

Various aspects of the subject-matter described herein may be set out non-exhaustively in the following numbered clauses:

1. A method for manufacturing a header for a semiconductor package, comprising:
    forming an eyelet having a first surface, a second surface opposite to the first surface, and a through hole penetrating the eyelet from the first surface to the second surface;
    forming a metal block having a pedestal, and a columnar part protruding from the pedestal; and
    inserting the pedestal into the through hole, so that a portion of the columnar part protrudes from the first surface,
    wherein the forming the metal block includes
        forming a rod-shaped material into a predetermined shape by a drawing process,
        cutting the material having the predetermined shape by a singulating process,
        pressing a periphery of a portion of each singulated material, which becomes the columnar part, using a die by a forming process, and
        planarizing a portion of the columnar part, which becomes a device mounting surface on which a semiconductor device is mounted, by a planarizing process,
    wherein the planarizing process exposes an outer periphery of the pedestal around the columnar part in a plan view.

2. The method for manufacturing the header for the semiconductor package according to clause 1, wherein the pressed portion of each singulated material pressed by the forming process is smaller than a non-pressed portion of each singulated material, thereby forming the columnar part by the pressed portion and forming the pedestal by the non-pressed portion.

3. The method for manufacturing the header for the semiconductor package according to clause 1 or 2, wherein the inserting the pedestal inserts the pedestal into the through hole, so that a portion of the device mounting surface is located inside the through hole.

4. The method for manufacturing the header for the semiconductor package according to clause 3, wherein the inserting the pedestal inserts the pedestal into the through hole, so that an entire rollover region provided in a portion of the device mounting surface near the pedestal is located inside the through hole.

5. The method for manufacturing the header for the semiconductor package according to any one of clauses 1 to 4, wherein the planarizing process exposes the outer periphery of the pedestal around the columnar part in the plan view, so that a width of the outer periphery at the device mounting surface is narrower than the width of the outer periphery at surfaces other than the device mounting surface.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A header for a semiconductor package, comprising:
    an eyelet having a first surface, a second surface opposite to the first surface, and a through hole penetrating the eyelet from the first surface to the second surface; and
    a metal block having a pedestal, and a columnar part protruding from the pedestal, wherein
    the pedestal is inserted into the through hole, so that a portion of the columnar part protrudes from the first surface,
    the columnar part includes a device mounting surface on which a semiconductor device is mounted,
    an outer periphery of the pedestal is exposed around the columnar part in a plan view,
    the pedestal has a generally rectangular shape in the plan view,
    corners at both ends of a first side of the pedestal at the device mounting surface are rounded, and
    corners at both ends of a second side of the pedestal, opposing the first side, are rounded with a radius larger than that of the corners at both ends of the first side.

2. The header for the semiconductor package as claimed in claim 1, wherein a portion of the device mounting surface is located inside the through hole.

3. The header for the semiconductor package as claimed in claim 2, wherein
 a rollover region is provided in a portion of the device mounting surface near the pedestal, and
 the entire rollover region is located inside the through hole.

4. The header for the semiconductor package as claimed in claim 1, wherein, at the outer periphery of the pedestal exposed around the columnar part, a width of the outer periphery at the device mounting surface is narrower than the width of the outer periphery at surfaces other than the device mounting surface.

5. The header for the semiconductor package as claimed in claim 1, further comprising:
 a metal base provided on the second surface of the eyelet, so as to close one end of the through hole,
 wherein the pedestal is inserted into the through hole and bonded to the metal base inside the through hole.

6. The header for the semiconductor package as claimed in claim 5, wherein the metal base has a thermal conductivity greater than or equal to a thermal conductivity of the eyelet.

7. The header for the semiconductor package as claimed in claim 1, wherein the eyelet includes lead-inserting through holes, penetrating the eyelet, and inserted with leads electrically connected to the semiconductor device.

8. A semiconductor package comprising:
 the header for the semiconductor package according to claim 1; and
 a semiconductor device mounted on the device mounting surface.

9. A semiconductor package comprising:
 the header for the semiconductor package according to claim 2; and
 a semiconductor device mounted on the device mounting surface.

10. A semiconductor package comprising:
 the header for the semiconductor package according to claim 5; and
 a semiconductor device mounted on the device mounting surface.

* * * * *